United States Patent
Takahashi

(10) Patent No.: US 6,310,800 B1
(45) Date of Patent: Oct. 30, 2001

(54) NON-VOLATILE SEMICONDUCTOR MEMORY DEVICE AND METHOD FOR DRIVING THE SAME

(75) Inventor: Keita Takahashi, Nara (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/603,888

(22) Filed: Jun. 26, 2000

Related U.S. Application Data

(62) Division of application No. 09/207,297, filed on Dec. 8, 1998, now Pat. No. 6,147,903.

(30) Foreign Application Priority Data

Dec. 12, 1997 (JP) .................................................. 9-342638

(51) Int. Cl.⁷ .................................................. G11C 16/04
(52) U.S. Cl. .............................. 365/185.05; 365/185.12; 365/185.18; 365/185.24
(58) Field of Search ......................... 365/185.05, 185.12, 365/185.18, 185.24, 185.26

(56) References Cited

U.S. PATENT DOCUMENTS

| | | | |
|---|---|---|---|
| 5,371,697 | * 12/1994 | Yamada | .................................. 365/49 |
| 5,428,568 | 6/1995 | Kobayashi et al. . | |
| 5,627,779 | 5/1997 | Odake et al. . | |
| 5,715,196 | 2/1998 | Odake et al. . | |
| 5,761,117 | 6/1998 | Uchino et al. . | |
| 5,831,905 | * 11/1998 | Hirano | ............................. 365/185.29 |
| 5,850,091 | * 12/1998 | Li et al. | ................................. 257/316 |
| 5,949,718 | 9/1999 | Randolph et al. . | |

FOREIGN PATENT DOCUMENTS

| | | |
|---|---|---|
| 03057048 | 3/1991 | (JP) . |
| 04365797 | 12/1992 | (JP) . |
| 06244434 | 9/1994 | (JP) . |
| 09307005 | 11/1997 | (JP) . |

OTHER PUBLICATIONS

Japanese Office Action dated Sep. 24, 1999 related to Japanese Patent Application No. 10–340761 (English translation included).

* cited by examiner

*Primary Examiner*—David Nelms
*Assistant Examiner*—Gene N. Auduong
(74) *Attorney, Agent, or Firm*—Renner, Otto, Boisselle & Sklar, LLP

(57) ABSTRACT

A non-volatile semiconductor memory device of the present invention includes, on a semiconductor substrate, a plurality of memory cells arranged in a matrix, a plurality of word lines extending in a row direction, a plurality of source lines extending in the row direction, and a plurality of bit lines extending in a column direction, wherein a plurality of memory cells belonging to a certain row are connected to a first source line among the plurality of source lines, a plurality of memory cells belonging to a row adjacent to the certain row are connected to a second source line among the plurality of source lines, and the first source line is electrically independent from the second source line.

12 Claims, 17 Drawing Sheets

NON-VOLATILE SEMICONDUCTOR MEMORY DEVICE AND METHOD FOR DRIVING THE SAME

This is a division of application Ser. No. 09/207,297, filed Dec. 8, 1998 now U.S. Pat. No. 6,147,903.

BACKGROUND OF THE INVENTION

1. Field of the Invention

The present invention relates to a non-volatile semiconductor memory device, and particularly to mask type and floating gate electrode type non-volatile semiconductor memory devices and a method for driving the same.

2. Description of the Related Art

In recent years, a non-volatile semiconductor memory device which operates at a low voltage and a high speed has been utilized. In order to widely provide such a non-volatile semiconductor memory device, there is a demand for a non-volatile semiconductor memory device capable of operating at a low voltage and a high speed, and a method for driving the same.

Hereinafter, a conventional non-volatile semiconductor memory device 500 will be described with reference to FIGS. 15, 16, and 17.

The non-volatile semiconductor memory device 500 has a NOR type memory cell array structure, in which a plurality of memory cells are connected in parallel to bit lines.

FIG. 15 is a schematic diagram showing a structure of a memory cell array of the non-volatile semiconductor memory device 500.

The non-volatile semiconductor memory device 500 shown in FIG. 15 includes memory cells M11 through M44 composed of MOS transistors, word lines WL1 through WL4, source lines SL1 through SL3, and bit lines BL1 through BL4.

In the non-volatile semiconductor memory device 500, as shown in FIG. 15, a gate of the memory cell M24 is connected to the word line WL2, a source of the memory cell M24 is connected to the source line SL2, and a drain of the memory cell M24 is connected to the bit line BL4. In the non-volatile semiconductor memory device 500, the memory cells M21 through M24 and the memory cells M31 through M34 share the source line SL2. The memory cells M11 through M14 and the memory cells (not shown) opposed thereto share the source line SL1. This is also applicable to the source line SL3.

FIG. 16 is a schematic plan view showing a layout pattern of the non-volatile semiconductor memory device 500 shown in FIG. 15.

As shown in FIG. 16, the non-volatile semiconductor memory device 500 includes isolation regions 5 and bit line contacts 6.

Hereinafter, a write method and a read method of the non-volatile semiconductor memory device 500 will be described with reference to FIG. 17.

FIG. 17 shows a threshold voltage distribution diagram of memory cells in the non-volatile semiconductor memory device 500. In FIG. 17, the abscissa represents a threshold voltage $V_{TM}$ of the memory cells, and the ordinate represents the number of memory cells.

It is assumed herein that the non-volatile semiconductor memory device 500 is a mask ROM composed of N-type MOS transistors having two different threshold voltages.

An erase state ("E" state in FIG. 17) refers to that N-type MOS transistors are set at a threshold voltage (lower threshold voltage) of about 1 volt, in which the N-type MOS transistors are in an enhancement state. The erase state is controlled by ion implantation to the channel portions of memory cells in the entire memory array.

A write state ("W" state in FIG. 17) refers to that ions are additionally implanted only to the channels of selected N-type MOS transistors, whereby the selected N-type MOS transistors are set at a threshold voltage (higher threshold voltage) of about 4 volts, which is higher than a supply voltage $V_{DD}$ and in which the N-type MOS transistors are in an enhancement state.

Hereinafter, a read method of the non-volatile semiconductor memory device 500 will be described with reference to FIG. 15.

In the case where the memory cell M24 surrounded by a broken line in FIG. 15 is selected, an electric potential of a semiconductor substrate is set at a ground voltage (0 volts), the word line WL2 is set at about 3 volts, and the bit line BL4 is set at about 1 volt, respectively. Furthermore, the other word lines WL1, WL3, and WL4, the source lines SL1 through SL3, and the other bit lines BL1, BL2, and BL3 are set at about 0 volts or set to be an OPEN state. The semiconductor substrate on which a memory array is arranged in FIG. 15 is fixed at a ground voltage, based on which a voltage is applied to the other portions.

If the memory cell M24 is in an erase state, the threshold voltage thereof is set at about 0.5 volts. Therefore, the memory cell M24 turns on, and a current for reading information from the memory cell flows through the bit line BL4. On the other hand, if the memory cell M24 is in a write state, the threshold voltage thereof is set at about 4 volts. Therefore, the memory cell M24 turns off, and a current for reading information from the memory cell does not flow through the bit line BL4. The amount of the current is detected by a sense amplifier, and a read operation is performed.

As described above, the information stored in the selected memory cell M24 is read by using the amount of the current for reading the information from the memory cell which flows through the memory cell M24. Therefore, it is required that currents flowing from the non-selected memory cells M14, M34, and M44 connected to the bit line BL4 to which the memory cell M24 is also connected are set at about 0. In order to do this, the threshold voltages of these non-selected memory cells are required to be set at about 0.5 volts or higher.

However, in the non-volatile semiconductor memory device 500 and the method for rewriting information using the same, the threshold voltage of a memory cell in an erase state (i.e., the lower threshold voltage) is set at about 0.5 volts or higher. Therefore, if the non-volatile semiconductor memory device 500 is operated at a low voltage (lower supply voltage), the amount of a current for reading information from the memory cell in an erase state (ON state) becomes small during reading, making it difficult to read information at a high speed.

SUMMARY OF THE INVENTION

A non-volatile semiconductor memory device of the present invention includes, on a semiconductor substrate, a plurality of memory cells arranged in a matrix, a plurality of word lines extending in a row direction, a plurality of source lines extending in the row direction, and a plurality of bit lines extending in a column direction, wherein a plurality of memory cells belonging to a certain row are connected to a first source line among the plurality of source lines, a plurality of memory cells belonging to a row adjacent to the certain row are connected to a second source line among the plurality of source lines, and the first source line is electrically independent from the second source line.

In one embodiment of the present invention, the first source line is insulated from the second source line by an isolation region.

A non-volatile semiconductor memory device of the present invention includes, on a semiconductor substrate, a plurality of memory cells arranged in a matrix, a plurality of word lines extending in a row direction, a plurality of source lines extending in the row direction, and a plurality of bit lines extending in a column direction, wherein a first group among a plurality of memory cells belonging to a certain column are connected to a first bit line among the plurality of bit lines, a second group among a plurality of memory cells belonging to the certain column are connected to a second bit line among the plurality of bit lines, and the first bit line is electrically independent from the second bit line.

In one embodiment of the present invention, the first group is adjacent to the second group in the column direction.

In another embodiment of the present invention, each of the plurality of memory cells is a MOS transistor having a gate electrode, a gate insulating film, a drain region, and a source region.

In another embodiment of the present invention, each of the plurality of memory cells is a floating gate electrode type MOS transistor having a control gate electrode, a floating gate electrode, a drain region, and a source region.

In another embodiment of the present invention, a memory cell having a lower threshold voltage among the plurality of memory cells is in a depletion state.

The above-mentioned non-volatile semiconductor memory device includes a plurality of first conductivity type wells extending in the row direction, wherein one of the plurality of memory cells is a MOS transistor having a gate electrode, a gate insulating film, a drain region, and a source region on one of the plurality of first conductivity type wells, and each of the plurality of first conductivity type wells is electrically independent.

The above-mentioned non-volatile semiconductor memory device includes a plurality of first conductivity type wells extending in the row direction, wherein one of the plurality of memory cells is a MOS transistor having a control gate electrode, a floating gate electrode, a gate insulating film, a drain region, and a source region on one of the plurality of first conductivity type wells, and each of the plurality of first conductivity type wells is electrically independent.

A method for driving the above-mentioned non-volatile semiconductor memory device, in which information is read from a memory cell selected from the plurality of memory cells, includes the steps of: applying a first voltage having a polarity which is reverse-biased with respect to the semiconductor substrate to a bit line corresponding to the selected memory cell; applying a second voltage having the same polarity as a polarity of the first voltage to a word line corresponding to the selected memory cell; applying a third voltage having the same polarity as a polarity of the first voltage to a source line corresponding to memory cells other than the selected memory cell; and applying an electric potential of the semiconductor substrate to a source line corresponding to the selected memory cell.

In one embodiment of the present invention, the first voltage and the third voltage have substantially the same.

A method for driving the above-mentioned non-volatile semiconductor memory device, in which information is read from a memory cell selected from the plurality of memory cells, includes the steps of: applying a first voltage having a polarity which is reverse-biased with respect to the semiconductor substrate to a bit line corresponding to the selected memory cell; applying a second voltage having a polarity identical with a polarity of the first voltage to a word line corresponding to the selected memory cell; applying a third voltage having a polarity opposite to a polarity of the first voltage to a first conductivity type well to which the selected memory cell does not belong; and applying a ground potential to a first conductivity type well to which the selected memory cell belongs.

Hereinafter, the function of the present invention will be described.

According to the present invention, a lower limit of a threshold voltage of a selected memory cell is set so that the selected memory cell is in a depletion state, and a lower limit of a threshold voltage of non-selected memory cells connected to a bit line to which the selected memory cell is also connected is set so that those non-selected memory cells are in an enhancement state due to a back bias effect.

A non-volatile semiconductor memory device of the present invention has an array structure in which an electrical potential of a source line of a selected memory cell is set to be different from that of a source line of non-selected memory cells. Alternatively, the non-volatile semiconductor memory device of the present invention has an array structure in which an electric potential of a well line of the selected memory cell is set to be different from that of a well line of the non-selected memory cells.

Furthermore, writing and erasing of information in the non-volatile semiconductor memory device of the present invention allows a lower limit of a threshold voltage of a memory cell in an erase state to be a depletion state.

Furthermore, according to a method for driving a non-volatile semiconductor memory device in which information is read from a memory cell selected from a plurality of memory cells, a source line of the selected memory cell is set at a ground voltage and a source line of non-selected memory cells is set at a positive voltage, or a well line of the selected memory cell is set at a ground voltage and a well line of the non-selected memory cell is set at a negative voltage.

In the non-volatile semiconductor memory device of the present invention, a threshold voltage of non-selected memory cells is increased due to a back bias effect by applying a voltage, which is reverse-biased with respect to a semiconductor substrate, to a source line of the non-selected memory cells. Therefore, in the non-volatile semiconductor memory device of the present invention, a lower threshold voltage of a memory cell can be set lower than that in a conventional non-volatile semiconductor memory device, and a sufficient amount of a current for reading information from a memory cell in an ON state can be maintained. As a result, the non-volatile semiconductor memory device of the present invention realizes high-speed reading even at a low voltage.

In the non-volatile semiconductor memory device of the present invention, since at least a part of memory cells having a lower threshold voltage is in a depletion state. Therefore, a current for reading information in this state can be increased, and a read speed can be enhanced even at a low voltage.

According to a method for driving a non-volatile semiconductor memory device in which information is read from a memory cell selected from a plurality of memory cells, a threshold voltage of non-selected memory cells can be increased due to a back bias effect by applying a voltage, which is reverse-biased with respect to a semiconductor substrate, to a source line of the non-selected memory cells. Thus, according to the driving method of the present invention, a lower threshold voltage of a memory cell can be set lower than that in a conventional driving method, and a sufficient amount of a current for reading information from a memory cell in an ON state can be maintained even at a low voltage. As a result, the driving method of the present invention realizes high-speed reading even at a low voltage.

According to the driving method of the present invention, a back bias effect is large, and a current does not leak from a source line. Therefore, high-speed read performance can be enhanced.

In an alternative non-volatile semiconductor memory device of the present invention, a threshold voltage of non-selected memory cells is increased due to a back bias effect by applying a voltage, which is forward-biased with respect to a semiconductor substrate, to a well line of the non-selected memory cells. Therefore, in the alternative non-volatile semiconductor memory device of the present invention, a lower threshold voltage of a memory cell can be set lower than that in a conventional non-volatile semiconductor memory device, and a sufficient amount of a current for reading information from a memory cell in an ON state can be maintained. As a result, the alternative non-volatile semiconductor memory device of the present invention realizes high-speed reading even at a low voltage.

In the alternative semiconductor memory device of the present invention, at least a part of memory cells having a lower threshold voltage is in a depletion state. Therefore, the amount of a current for reading information in this state can be increased, and a read speed can be further enhanced even at a lower voltage.

According to an alternative method for driving a non-volatile semiconductor memory device in which information is read from a memory cell selected from a plurality of memory cells, a threshold voltage of non-selected memory cells can be increased due to a back bias effect by applying a voltage, which is forward-biased with respect to a semiconductor substrate, to a well line of the non-selected memory cells. Thus, according to the alternative driving method, a lower threshold voltage of a memory cell can be set lower than that in a conventional driving method. As a result, the alternative driving method of the present invention realizes high-speed reading even at a low voltage.

Thus, the invention described herein makes possible the advantages of: (1) providing a non-volatile semiconductor memory device which is capable of keeping a sufficient current for reading information from a memory cell in an ON state even at a low voltage and which enables information to be read at a high speed even at a low voltage; and (2) providing a method for driving the non-volatile semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Embodiment 1

Hereinafter, the first embodiment of the present invention will be described with reference to the drawings.

Figure 1:
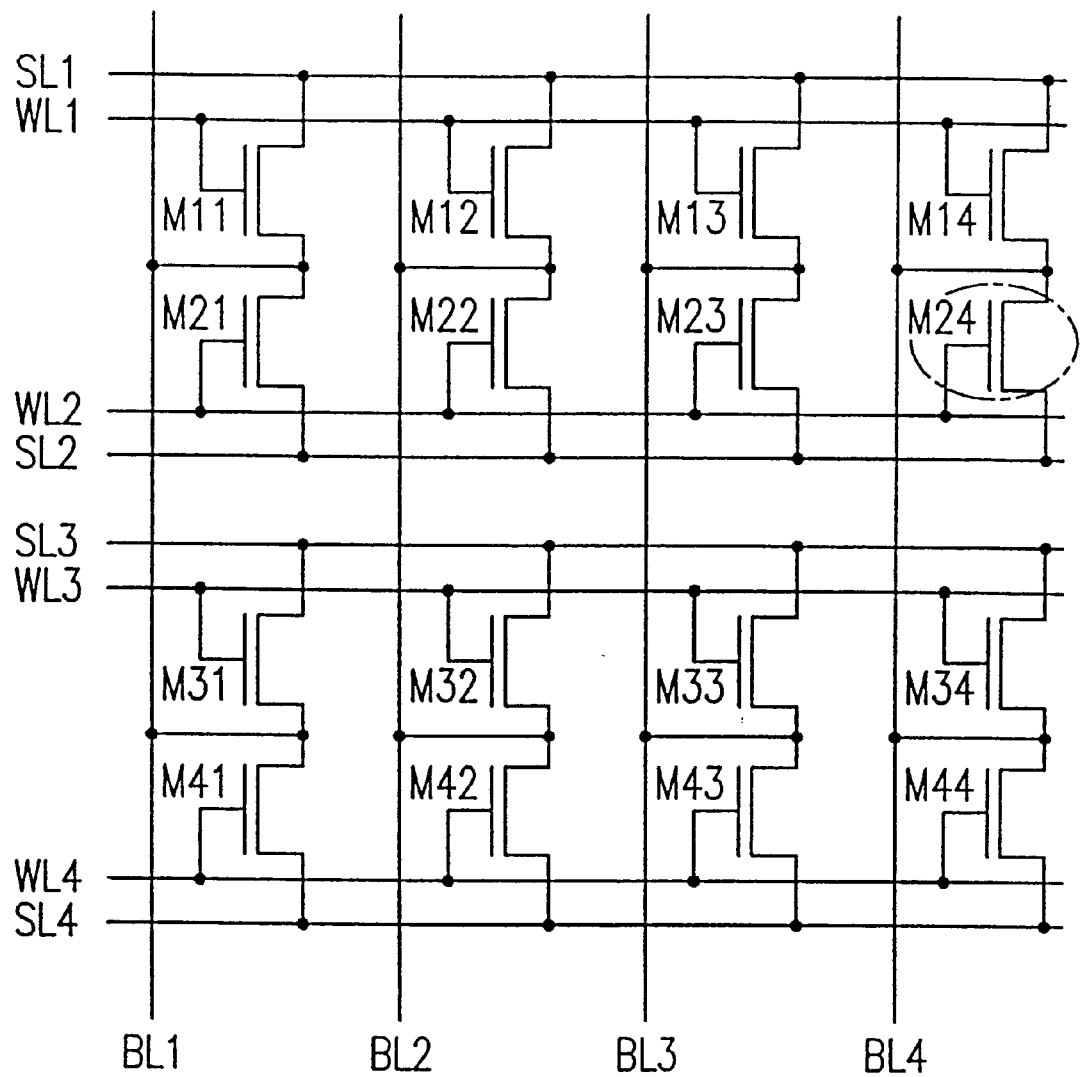
FIG. 1 is a schematic diagram showing a structure of a memory cell array of a non-volatile semiconductor memory device in the first embodiment of the present invention.

FIG. 1 is a schematic diagram showing a structure of a memory cell array of a non-volatile semiconductor memory device 10 in the first embodiment of the present invention.

The non-volatile semiconductor memory device 10 includes memory cells M11 through M44 composed of MOS transistors, word lines WL1 through WL4, source lines SL1 through SL4, and bit lines BL1 through BL4.

In the non-volatile semiconductor memory device 10, a gate of the memory cell M24 is connected to the word line WL2, a source of the memory cell M24 is connected to the source line SL2, and a drain of the memory cell M24 is connected to the bit line BL4.

The source line SL1 corresponds to a row to which the memory cells M11 through M14 belong, the source line SL2 corresponds to a row to which the memory cells M21 through M24 belong, the source line SL3 corresponds to a row to which the memory cells M31 through M34 belong, and the source line SL4 corresponds to a row to which the memory cells M41 through M44 belong. More specifically, in the non-volatile semiconductor memory device 10, memory cells in a certain row do not share a source line with memory cells in another row.

Figure 2:
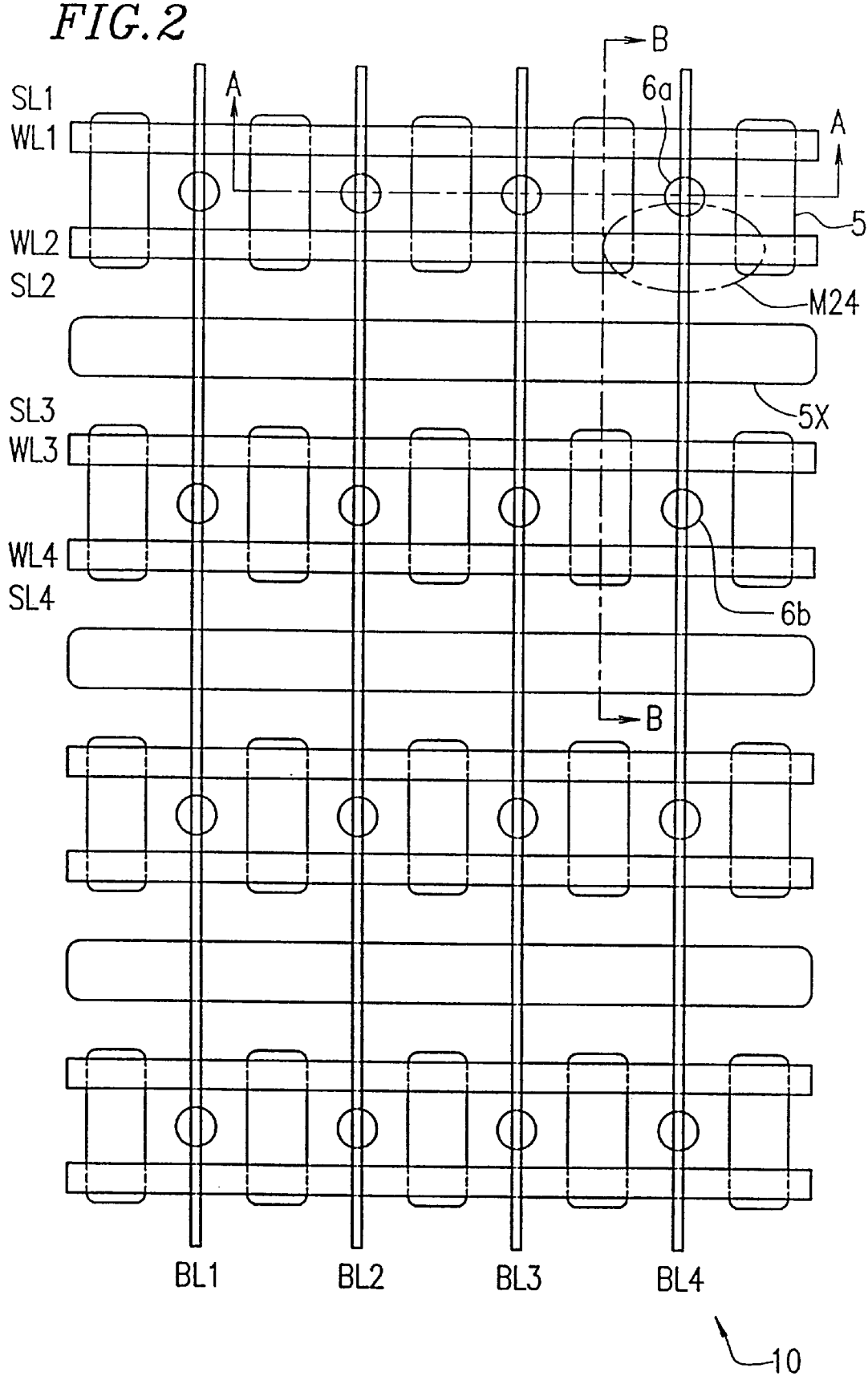
FIG. 2 is a schematic plan view showing a layout pattern of the non-volatile semiconductor memory device in the first embodiment of the present invention.
Figure 3:
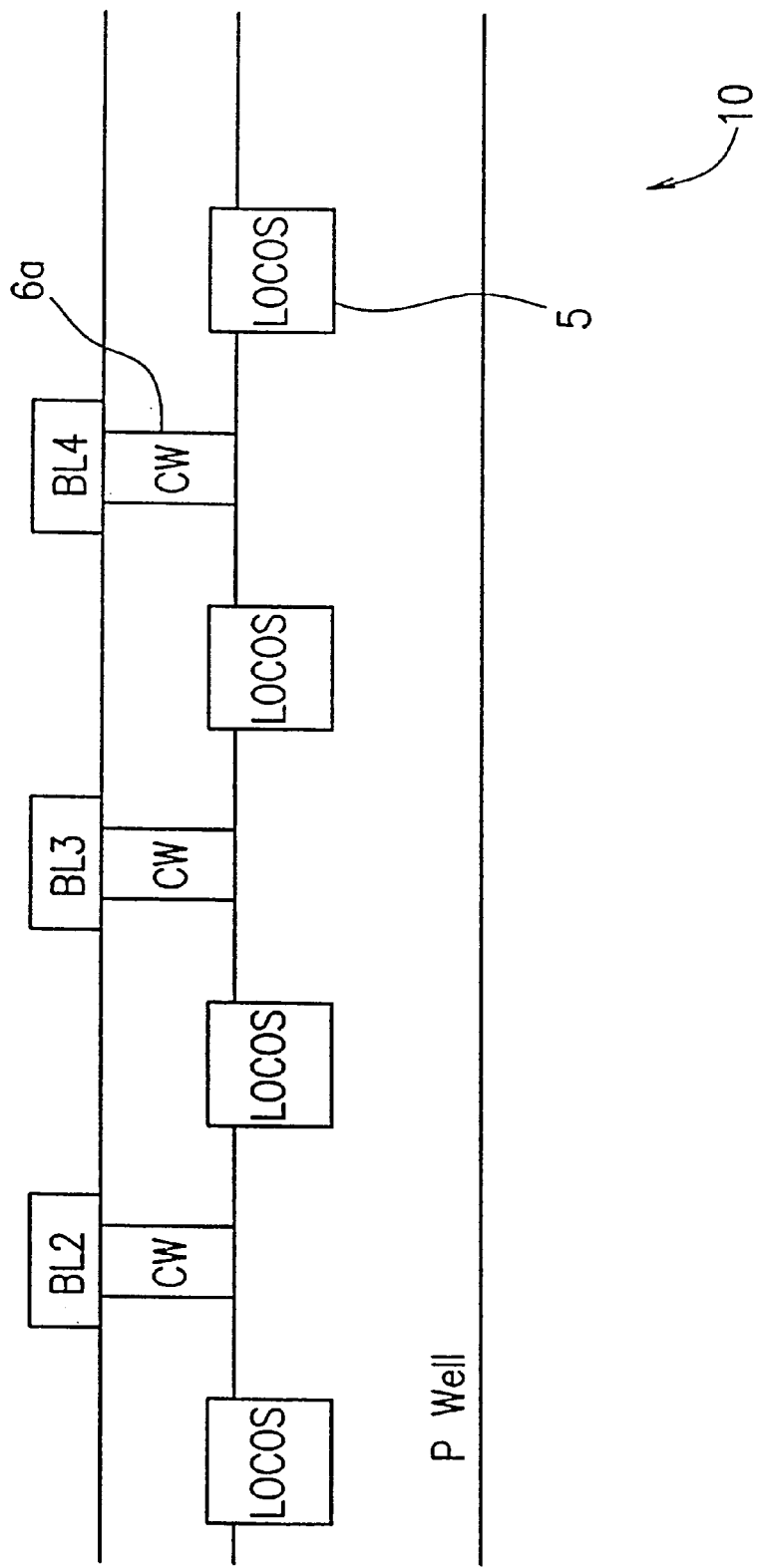
FIG. 3 is a cross-sectional view of the non-volatile semiconductor memory device in the first embodiment of the present invention taken along a line A—A shown in FIG. 2.
Figure 4:
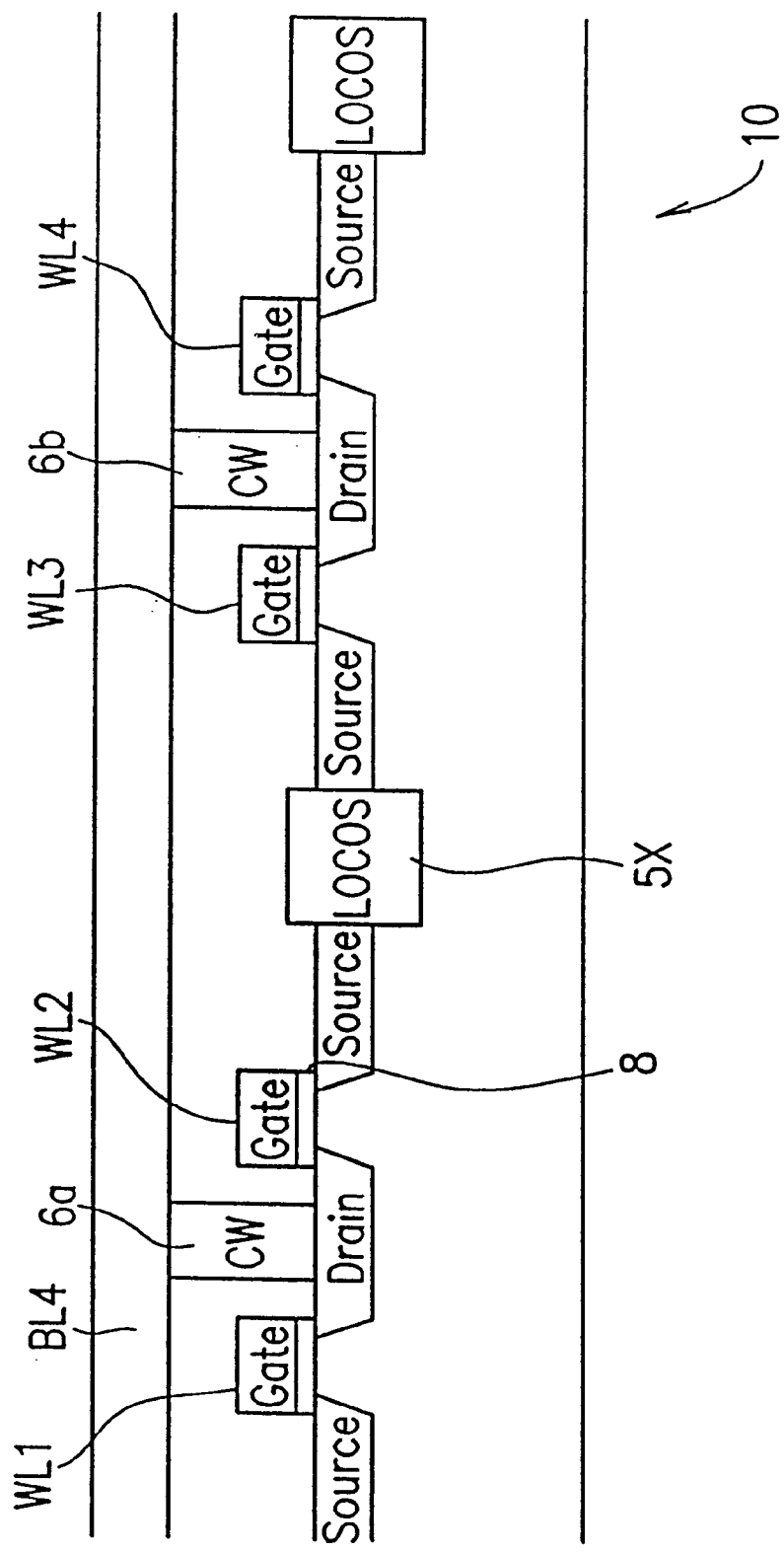
FIG. 4 is a cross-sectional view of the non-volatile semiconductor memory device in the first embodiment of the present invention taken along a line B—B shown in FIG. 2.

FIG. 2 is a schematic plan view showing a layout pattern of the non-volatile semiconductor memory device 10. More specifically, FIG. 2 shows an example of an array structure of the non-volatile semiconductor memory device 10 shown in FIG. 1. FIG. 3 is a cross-sectional view of the non-volatile semiconductor memory device 10 taken along a line A—A shown in FIG. 2, and FIG. 4 is a cross-sectional view of the non-volatile semiconductor memory device 10 taken along a line B—B shown in FIG. 2.

The non-volatile semiconductor memory device 10 has a NOR type memory cell array structure in which a plurality of memory cells are connected in parallel to bit lines.

As shown in FIG. 2, the non-volatile semiconductor memory device 10 further includes insulation regions 5, insulation regions 5X, and bit line contacts 6a and 6b. For example, the isolation region 5X is positioned between the source lines SL2 and SL3 adjacent to each other. Therefore, the adjacent source lines are electrically independent from each other. The isolation regions 5 and the isolation regions 5X are formed by LOCOS (Local Oxidation of Silicon), STI (Shallow Trench Isolation), etc. However, other methods may be used.

Hereinafter, a write method and an erase method of the non-volatile semiconductor memory device 10 will be described with reference to FIG. 5.

Figure 5:
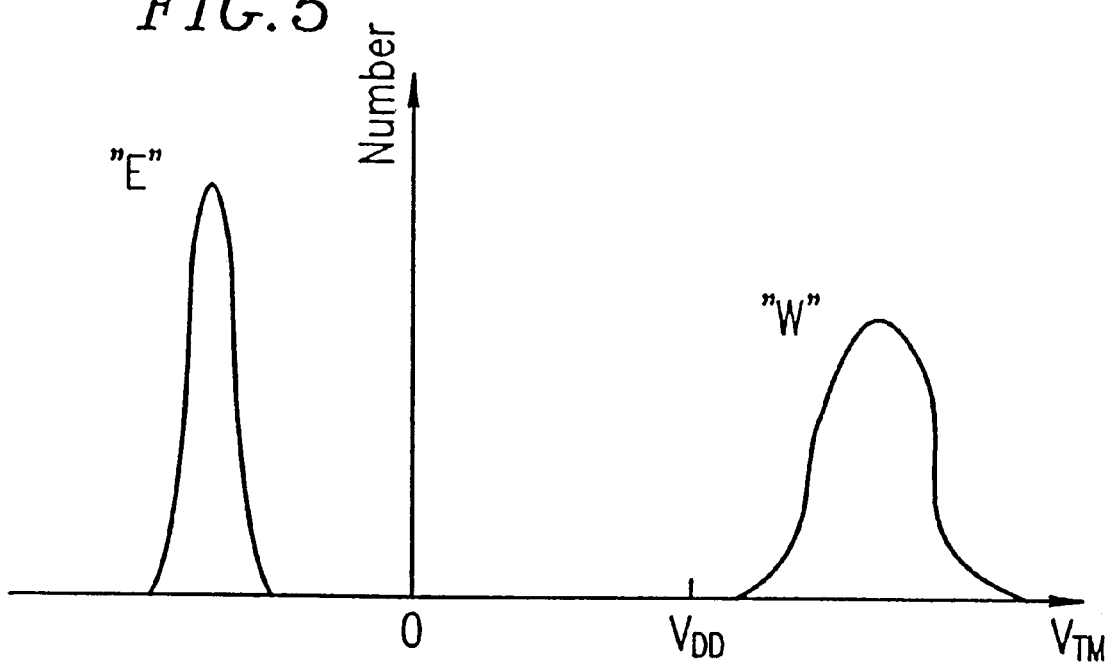
FIG. 5 is a threshold voltage distribution diagram of memory cells in the non-volatile semiconductor memory device in the first embodiment of the present invention.

FIG. 5 shows a threshold voltage distribution diagram of memory cells in the non-volatile semiconductor memory device 10. In FIG. 5, the abscissa represents a threshold voltage $V_{TM}$ of the memory cells, and the ordinate represents the number of memory cells.

It is assumed herein that the non-volatile memory device 10 is a mask ROM composed of N-type MOS transistors having two difference threshold voltages.

An erase state ("E" state in FIG. 5) refers to that N-type MOS transistors are set at a threshold voltage (lower threshold voltage) of about −1 volt, in which the N-type MOS transistors are in a depletion state. An erase state can be controlled by ion implantation to the channel portions of memory cells in the entire memory array.

A write state ("W" state in FIG. 5) refers to that ions are additionally implanted only to the channel portions of selected N-type MOS transistors, whereby the selected N-type MOS transistors are set at a threshold voltage (higher threshold voltage) of about 4 volts, which is higher than a supply voltage $V_{DD}$ and in which the N-type MOS transistors are in an enhancement state.

Hereinafter, a read method of the non-volatile semiconductor memory device 10 will be described with reference to FIG. 6.

Figure 6:
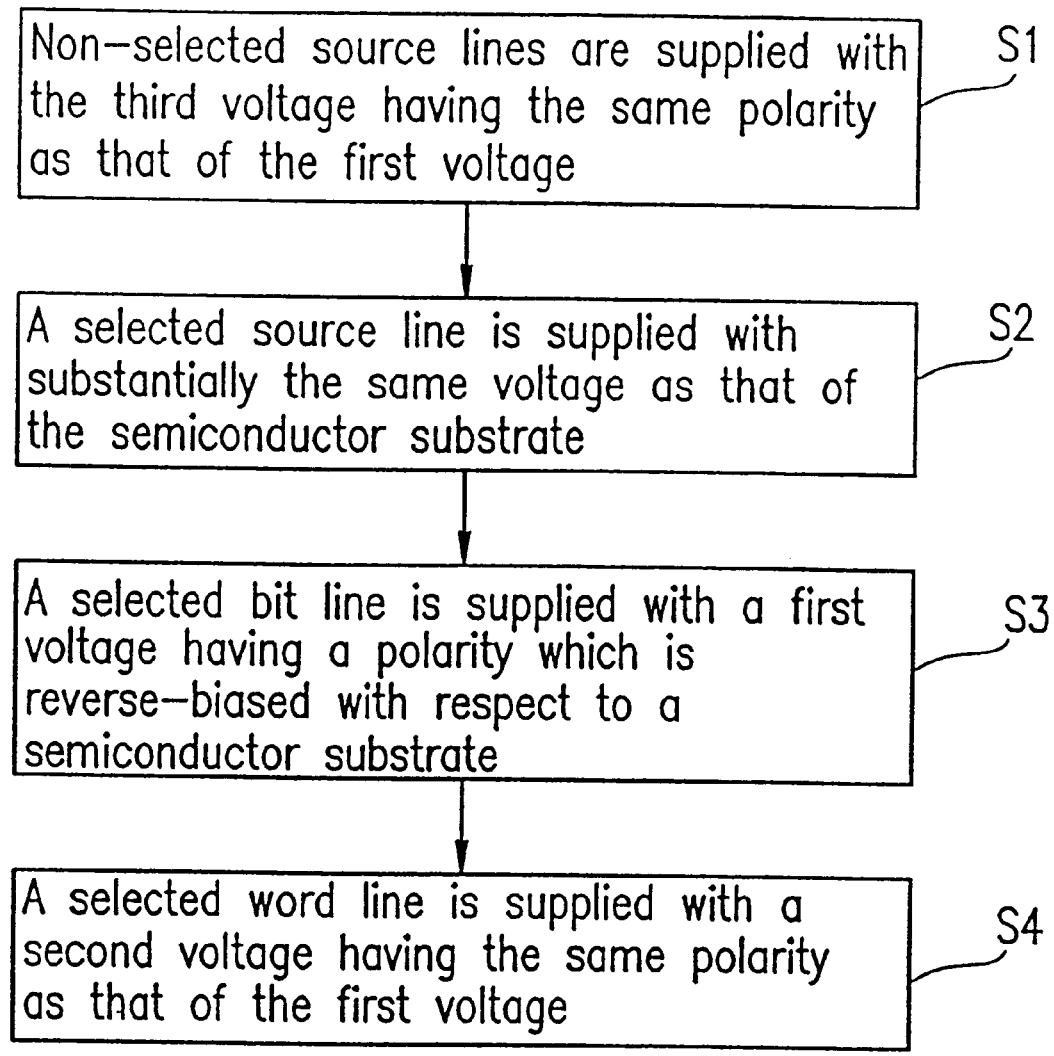
FIG. 6 is an exemplary flow chart showing the steps of reading information in the non-volatile semiconductor memory device in the first embodiment of the present invention.

FIG. 6 is an exemplary flow chart showing the steps of reading information in the non-volatile semiconductor memory device 10.

At Step S1, source lines which are not selected (i.e., non-selected source lines) are supplied with a third voltage having the same polarity as that of a first voltage. It is noted that the first voltage refers to a voltage applied to a selected bit line at Step S3 described later.

At Step S2, a source line corresponding to an arbitrary memory cell which is to be selected is selected, and the selected source line is supplied with a voltage which is substantially the same as an electrical potential of a semiconductor substrate.

At Step S3, a bit line corresponding to the arbitrary memory cell is selected, and the selected bit line is supplied with the first voltage having a polarity which is reverse-biased with respect to the semiconductor substrate.

At Step S4, a word line corresponding to the arbitrary memory cell is selected, and the selected word line is supplied with a second voltage having the same polarity as that of the first voltage.

During the above-mentioned steps, when information is read from the selected memory cell under the condition that the non-selected memory cells have a lower threshold voltage, the non-selected memory cells having a lower threshold voltage can be set in an enhancement state due to the back bias effect, even though they are in a depletion state. Therefore, a current is prevented from leaking from the non-selected memory cells to the bit line connected to the selected memory cell.

Furthermore, in the case where the selected memory cell is in an erase state (i.e., in the case where the selected memory cell has a lower threshold voltage), the selected memory cell can be set in a depletion state. As a result, the difference between the voltage applied to the gate of the selected memory cell and the threshold voltage is widened, whereby the amount of a current for reading information from the selected memory cell can be increased.

In the present embodiment, Steps S1 through S4 are not required to be performed in this order. More specifically, even when Steps S1 through S4 are performed in a random order, the present embodiment has the above-mentioned effect.

Furthermore, the first voltage applied to the selected bit line may be substantially the same as the third voltage applied to the non-selected source lines.

Hereinafter, a method for reading information from the memory cell M24 in the non-volatile semiconductor memory device 10 will be described.

In FIGS. 1 and 2, in the case where the memory cell M24 surrounded by a broken line is selected, an electric potential of a semiconductor substrate is set at a ground voltage (about 0 volts), the word line WL2 is set at about 3 volts (second voltage), and the bit line BL4 is set at about 1 volt (first voltage). Furthermore, the other word lines WL1, WL3, and WL4 and the other bit lines BL1, Bl2, and BL3 are set at about 0 volts, and the source line SL2 is set at about 0 volts. Furthermore, the other source lines SL1, SL3, and SL4 are set at about 1 volt (third voltage). Although not shown in the figures, an electric potential of a well to which the memory cell M24 belongs is set at about 0 volts. If the memory cell M24 is in an erase state, the threshold voltage is set at about −1 volt. Therefore, the memory cell M24 turns on, and a current for reading information from the memory cell flows through the bit line BL4. A current for reading information from the memory cell M24 in this case becomes larger than the case where the threshold voltage of a memory cell in a conventional non-volatile semiconductor memory device is about 0.5 volts.

On the other hand, if the memory cell M24 is in a write state, the threshold voltage of the memory cell M24 is about 4 volts. Therefore, the memory cell M24 turns off, and a current for reading information from the memory cell does not flow through the bit line BL4. The amount of the current is detected by a sense amplifier, whereby a read operation is performed.

In the first embodiment of the present invention, by utilizing a back bias effect, the threshold voltage of the non-selected memory cells M14, M34, and M44 connected to the bit line BL4 to which the selected memory cell M24 is also connected can be set at about 0.5 volts or higher. More specifically, even if the threshold voltage of the non-selected memory cells is about −1 volt, the threshold voltage of the non-selected memory cells can be set at about 0.5 volts or higher due to the back bias effect by applying a voltage of about 1 volt to the source lines SL1, S13, and S14 of the non-selected memory cells. Therefore, a current flowing from the non-selected memory cells can be suppressed to about 0.

In the case where the non-selected memory cells M14, M34, and M44 have a lower threshold voltage, the non-selected memory cells M14, M34, and M44 can be set in an enhancement state during read operation, and a current leaking from the other non-selected memory cells M14, M34, and M44 connected to the bit line BL4 to which the selected memory cell M24 is also connected can be suppressed.

Furthermore, in the case where the selected memory cell is in an erase state, the lower threshold voltage of the selected memory cell can be set so that the memory cell is in a depletion state. Therefore, the amount of a current for reading information from the selected memory cell in an ON state is increased. Consequently, a sufficient amount of a current for reading information from the memory cell in an ON state can be maintained even at a low voltage, and the non-volatile semiconductor memory device in the first embodiment allows high-speed reading of information at a low voltage.

As described above, in the present embodiment, by applying a positive voltage, which is reverse-biased with respect to the semiconductor substrate, to a source line to which non-selected memory cells are connected, the threshold voltage of a memory cell in an erase state, (i.e., the lower threshold voltage) can be set so that the memory cell is in a depletion state. Therefore, even if a voltage applied to a gate of the selected memory cell is low, a sufficient amount of a current for reading information from the memory cell in an ON state can be maintained. As a result, even if a voltage applied to a gate of the selected memory cell is low, information can be read from the memory cell at a high speed.

In the first embodiment, a voltage applied to the selected bit line during reading is prescribed to be the same as that applied to source lines of the non-selected memory cells. However, these voltages may be different. In the case where the voltage of the non-selected source lines is lower than that applied to the selected bit line, the back bias effect is small. Therefore, the effect of the present invention becomes small. In contrast, in the case where the voltage of the non-selected source lines is higher than that applied to the selected bit line, a current flows from the source line, so that the effect of the present invention becomes small.

Embodiment 2

Hereinafter, the second embodiment of the present invention will be described with reference to the drawings.

Figure 7:
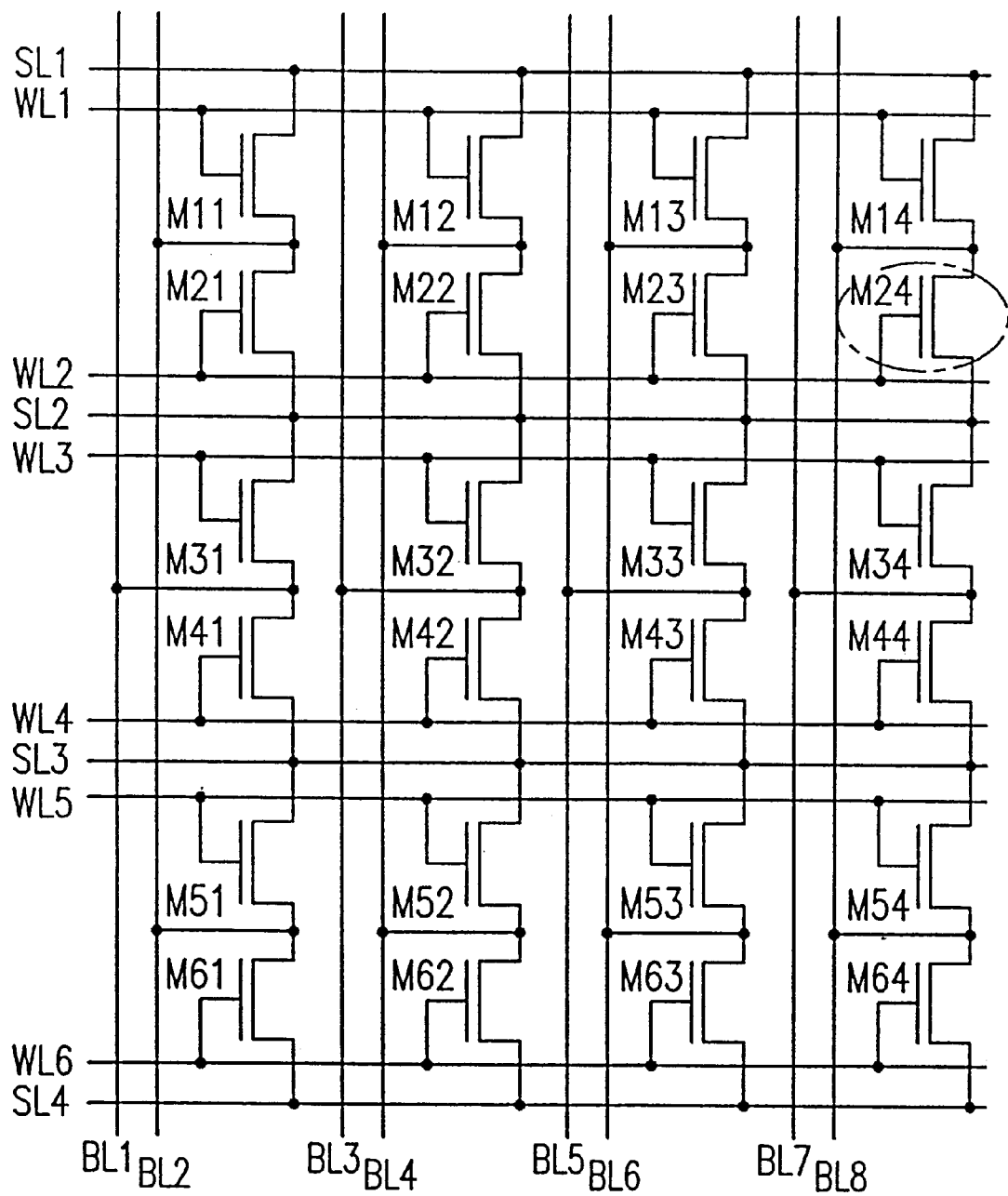
FIG. 7 is a schematic diagram showing a structure of memory cells in a non-volatile semiconductor memory device in the second embodiment of the present invention.
Figure 8:
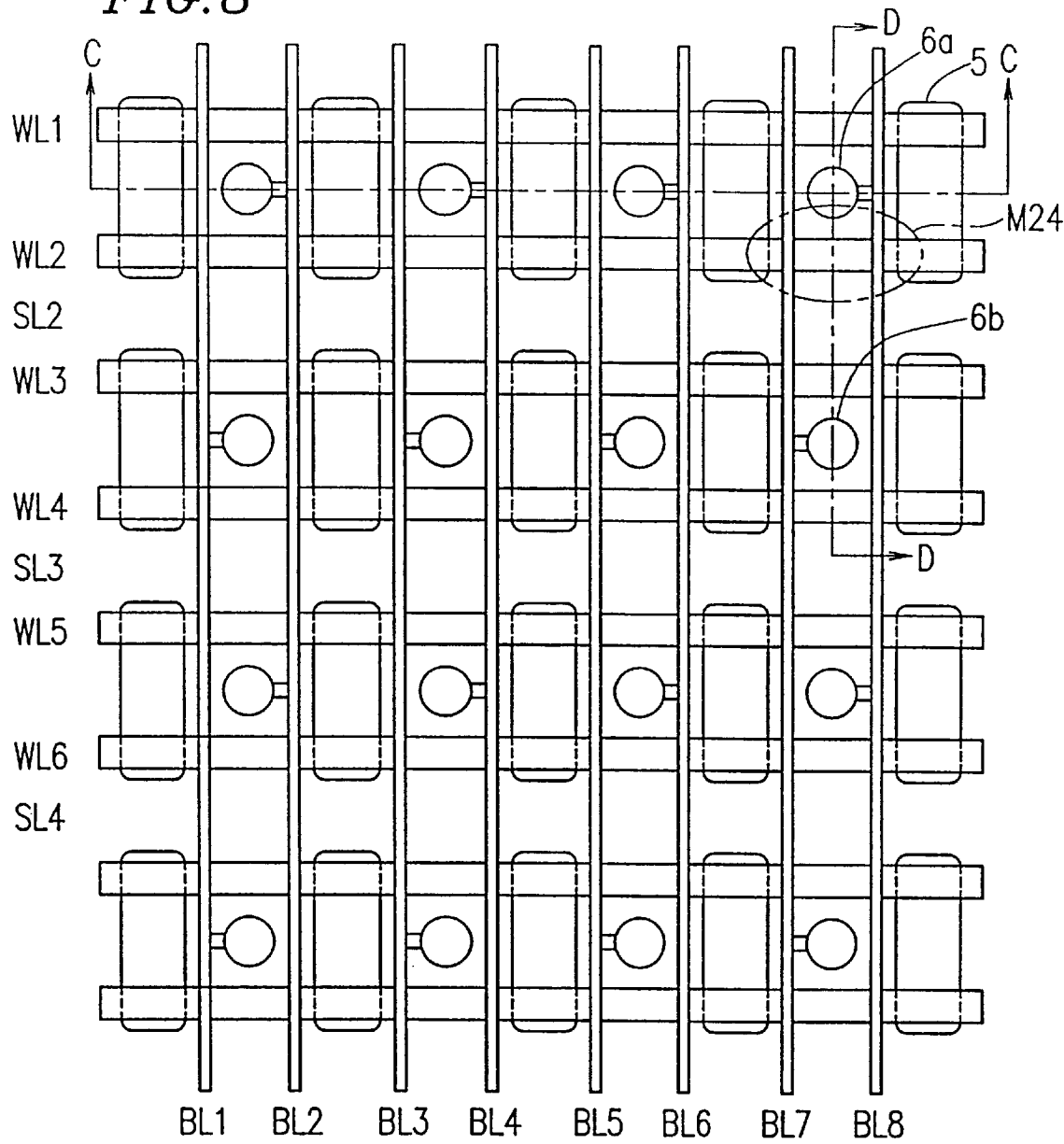
FIG. 8 is a schematic plan view showing a layout pattern of the non-volatile semiconductor memory device in the second embodiment of the present invention.
Figure 9:
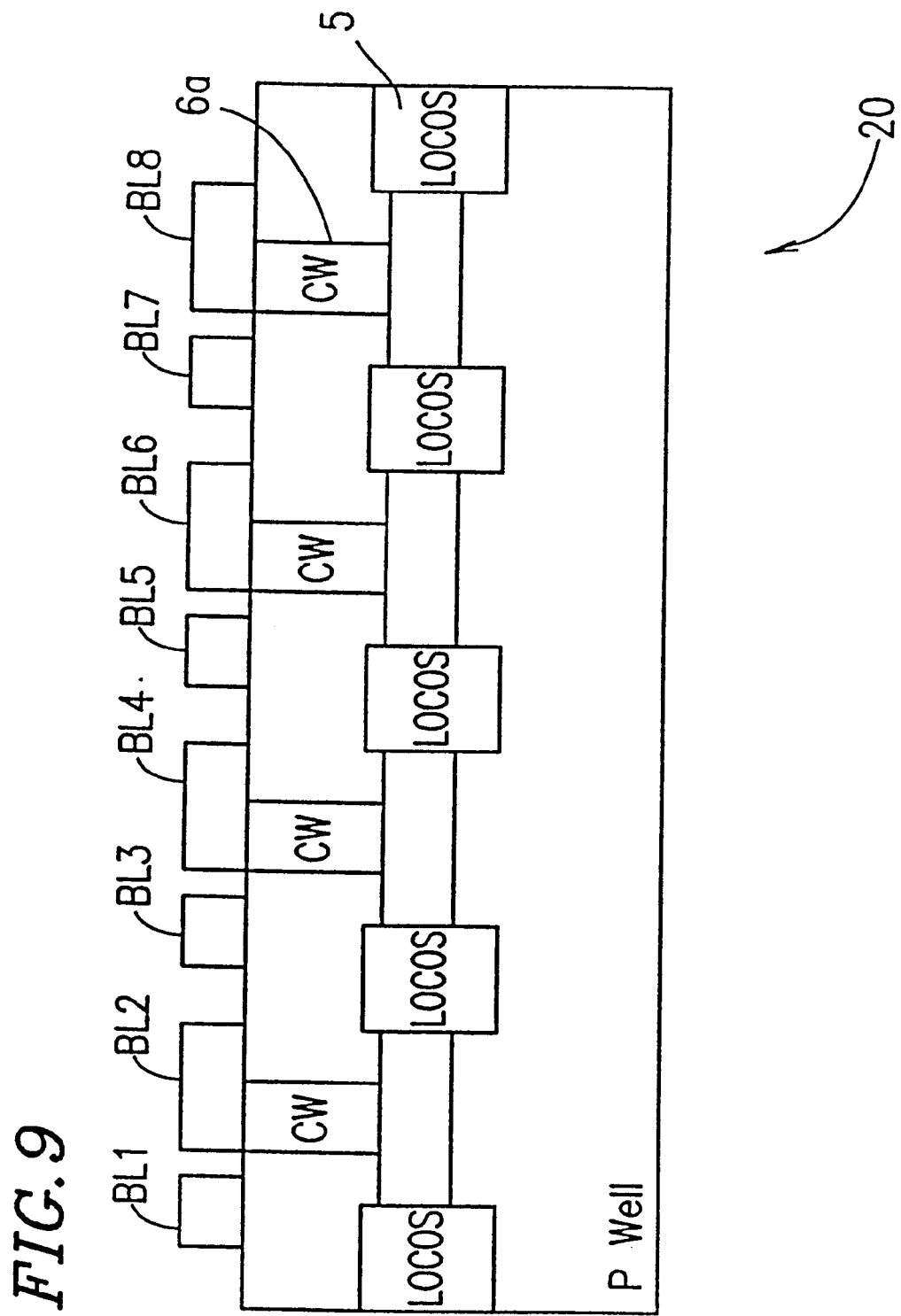
FIG. 9 is a cross-sectional view of the non-volatile semiconductor memory device in the second embodiment of the present invention taken along a line C—C shown in FIG. 8.
Figure 10:
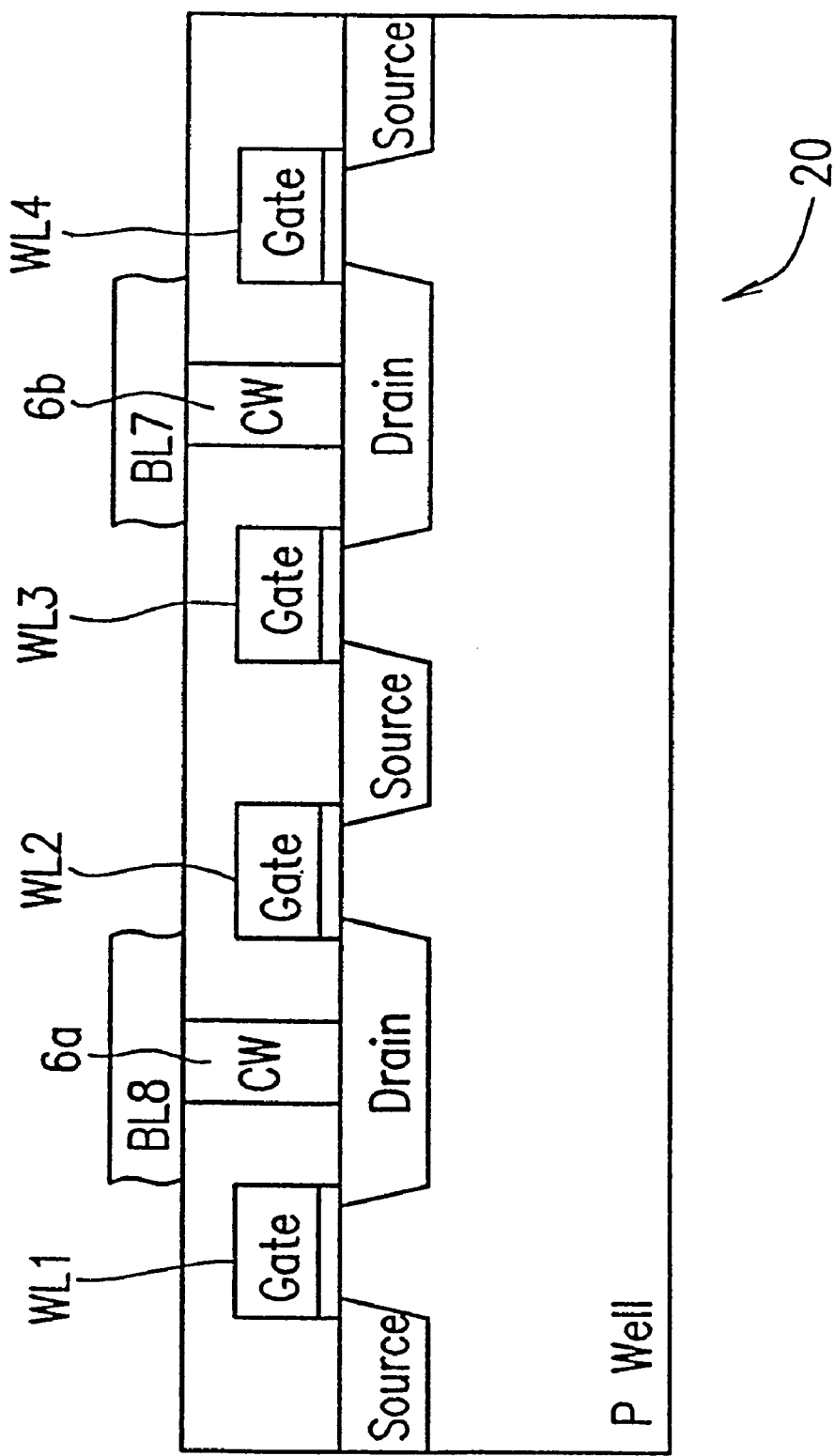
FIG. 10 is a cross-sectional view of the non-volatile semiconductor memory device in the second embodiment of the present invention taken along a line D—D shown in FIG. 8.

FIG. 7 is a schematic diagram showing a structure of a memory cell array of a non-volatile semiconductor memory device 20 in the second embodiment of the present invention. FIG. 8 is a schematic plan view showing a layout pattern of the non-volatile semiconductor memory device 20. More specifically, FIG. 8 shows an example of an array structure of the non-volatile semiconductor memory device 20 shown in FIG. 7. FIG. 9 is a cross-sectional view of the non-volatile semiconductor memory device 20 taken along a line C—C shown in FIG. 8. FIG. 10 is a cross-sectional view of the non-volatile semiconductor memory device 20 taken along a line D—D shown in FIG. 8. In FIG. 10, a bit line BL7 (which is not to be observed in the actual cross-section in a D-direction) is shown for easy understanding of the connection between the bit line BL7 and a bit line contact 6b.

The non-volatile semiconductor memory device 20 includes memory cells M11 through M64 composed of MOS transistors, word lines WL1 through WL6, source lines SL1 through SL4, and bit lines BL1 through BL8.

Furthermore, the non-volatile semiconductor memory device 20 includes isolation regions 5, and bit line contacts 6a and 6b. The isolation region 5 is formed by LOCOS, STI, etc. However, other methods may be used. The non-volatile semiconductor memory device 10 has a NOR type memory cell array structure in which a plurality of memory cells are connected in parallel to bit lines.

In the non-volatile semiconductor memory device 20, a gate of the memory cell M14 is connected to the word line WL1, a source of the memory cell M14 is connected to the source line SL1, a drain of the memory cell M14 is connected to the bit line BL8, a gate of the memory cell M24 is connected to the word line WL2, a source of the memory cell M24 is connected to the source line SL2, and a drain of the memory cell M24 is connected to the bit line BL8.

Furthermore, a gate of the memory cell M34 is connected to the word line WL3, a source of the memory cell M34 is connected to the source line SL2, a drain of the memory cell M34 is connected to the bit line BL7, a gate of the memory cell M44 is connected to the word line WL4, a source of the memory cell M44 is connected to the source line SL3, and a drain of the memory cell M44 is connected to the bit line BL7.

Furthermore, a gate of the memory cell M54 is connected to the word line WL5, a source of the memory cell M54 is connected to the source line SL3, a drain of the memory cell M54 is connected to the bit line BL8, a gate of the memory cell M64 is connected to the word line WL6, a source of the memory cell M64 is connected to the source line SL4, and a drain of the memory cell M64 is connected to the bit line BL8.

More specifically, the bit lines BL7 and BL8 correspond to columns to which the memory cells M14 through M64 belong. In other words, memory cells of a first group are connected to a first bit line, and memory cells of a second group adjacent to the first group are connected to a second bit line in a column direction, i.e., in a direction in which the first bit line extends. Two memory cells are included in each group, so that two memory cells share one bit line contact.

For example, the memory cells M14 and M24 belong to the first group, and the memory cells M14 and M24 share the bit line contact 6a, and the memory cells M14 and M24 of the first group are connected to the first bit line BL8 through the bit line contact 6a. The memory cells M34 and M44 belong to the second group. The second group is adjacent to the first group in a column direction. The memory cells M34 and M44 share the bit line contact 6b, and the memory cells M34 and M44 of the second group are connected to the second bit line BL7 through the bit line contact 6b.

A write method and an erase method in the non-volatile semiconductor memory device 20 are the same as those in the non-volatile semiconductor memory device 10.

Hereinafter, a read method of the non-volatile semiconductor memory device 20 will be described with reference to FIG. 11.

Figure 11:
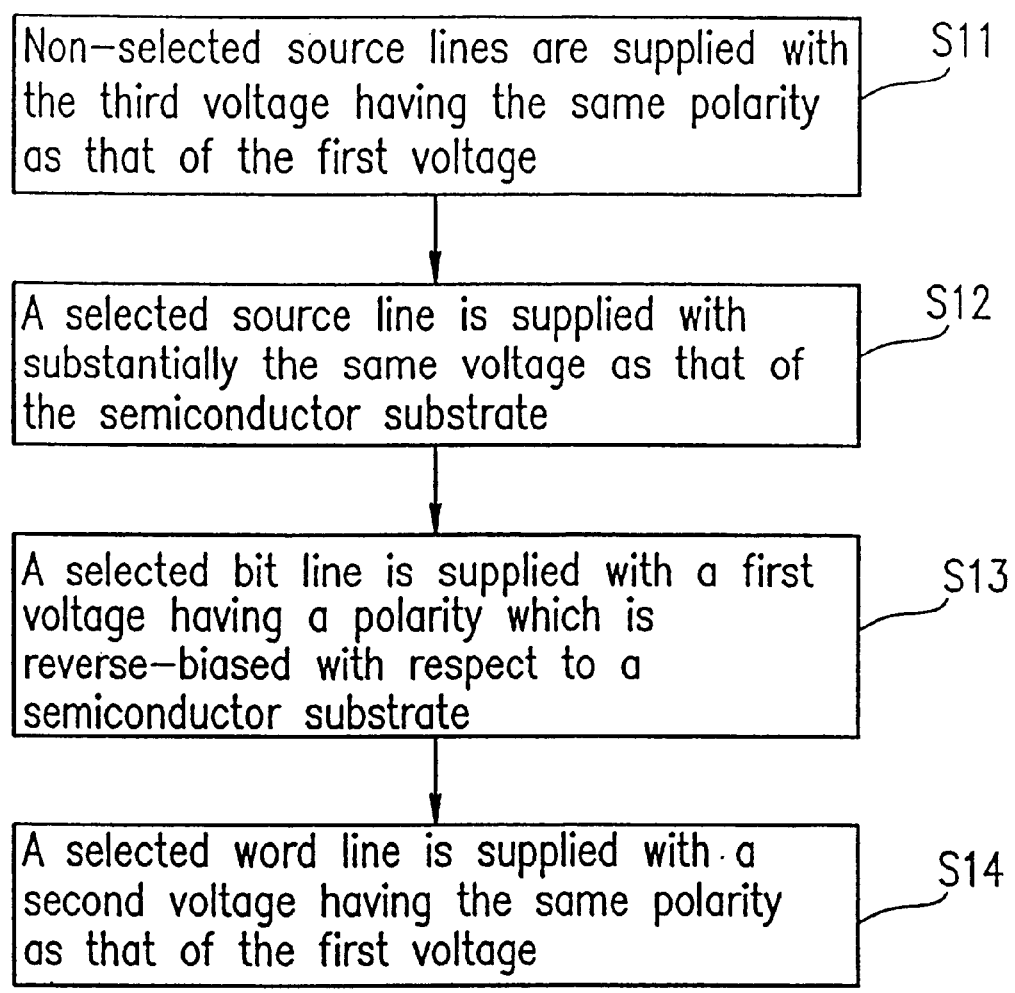
FIG. 11 is an exemplary flow chart showing the steps of reading information in the non-volatile semiconductor memory device in the second embodiment of the present invention.

FIG. 11 is an exemplary flow chart showing the steps of reading information in the non-volatile semiconductor memory device 20.

At Step S11, source lines which are not selected (i.e., non-selected source lines) are supplied with a third voltage having the same polarity as that of a first voltage. It is noted that the first voltage refers to a voltage which is applied to a selected bit line at Step S13 described later.

At Step S12, a source line corresponding to an arbitrary memory cell which is to be selected is selected, and the selected source line is supplied with a voltage which is substantially the same as an electrical potential of a semiconductor substrate.

At Step S13, a bit line corresponding to the arbitrary memory cell is selected, and the selected bit line is supplied with a first voltage having a polarity which is reverse-biased with respect to the semiconductor substrate.

At Step S14, a word line corresponding to the arbitrary memory cell is selected, and the selected word line is supplied with a second voltage having the same polarity as that of the first voltage.

During the above-mentioned steps, when information is read from the selected memory cell under the condition that the non-selected memory cells have a lower threshold voltage, the non-selected memory cells having a lower threshold voltage can be set in an enhancement state. Therefore, a current is prevented from leaking from the non-selected memory cells to the bit line connected to the selected memory cell.

Furthermore, in the case where the selected memory cell is in an erase state (i.e., in the case where the selected memory cell has a lower threshold voltage), the selected memory cell can be set in a depletion state. As a result, the difference between the voltage applied to the gate of the selected memory cell and the threshold voltage is widened, whereby the amount of a current for reading information from the selected memory cell can be increased.

In the present embodiment, Steps S11 through S14 are not required to be performed in this order. More specifically, even when Steps S11 through S14 are performed in a random order, the present embodiment has the above-mentioned effect.

Furthermore, the first voltage applied to the selected bit line may be substantially the same as the third voltage applied to the non-selected source lines.

Hereinafter, a method for reading information from the memory cell M24 in the non-volatile semiconductor memory device 20 will be described.

In FIGS. 7 and 8, in the case where the memory cell M24 surrounded by a broken line is selected, an electric potential of a semiconductor substrate is set at a ground voltage (0 volts), the word line WL2 is set at about 3 volts (second voltage), and the bit line BL8 is set at about 1 volt (first voltage). Furthermore, the other word lines WL1, and WL3 through WL6 and the other bit lines BL1 through B7 are set at about 0 volts or set to be an OPEN state, and the source line SL2 is set at about 0 volts. Furthermore, the other source lines SL1, SL3, and SL4 are set at about 1 volt (third voltage). Although not shown in the figures, an electric potential of a well to which the memory cell M24 belongs is set at about 0 volts. If the memory cell M24 is in an erase state, the threshold voltage thereof is set at about −1 volt. Therefore, the memory cell M24 turns on, and a current for reading information from the memory cell flows through the bit line BL8. A current for reading information from the memory cell M24 in this case becomes larger than the case where the threshold voltage of a memory cell in a conventional non-volatile semiconductor memory device is about 0.5 volts.

On the other hand, if the memory cell M24 is in a write state, the threshold voltage of the memory cell M24 is about 4 volts. Therefore, the memory cell M24 turns off, and a current for reading information from the memory cell does not flow through the bit line BL8. The amount of the current is detected by a sense amplifier, whereby a read operation is performed.

In the second embodiment of the present invention, by utilizing a back bias effect, the threshold voltage of the non-selected memory cells M14, M54, and M64 connected to the bit line BL8 to which the selected memory cell M24 is also connected can be set at about 0.5 volts or higher.

More specifically, even if the threshold voltage of the non-selected memory cells is about −1 volt, the threshold voltage of the non-selected memory cells can be set at about 0.5 volts or higher due to the back bias effect by applying a voltage of about 1 volt to the source lines SL1, S13, and S14 of the non-selected memory cells. Therefore, a current flowing from the non-selected memory cells can be suppressed to about 0.

Furthermore, in the case where the selected memory cell is in an erase state, the lower threshold voltage of the selected memory cell can be set so that the selected memory cell is in a depletion state. Therefore, the amount of a current for reading information from the selected memory cell in an ON state is increased. Consequently, a sufficient amount of a current for reading information from the memory cell in an ON state can be maintained even at a low voltage, and the non-volatile semiconductor memory device in the second embodiment allows high-speed reading of information at a low voltage.

In the second embodiment, a voltage applied to the selected bit line during reading is prescribed to be the same as that applied to source lines of the non-selected memory cells. However, these voltages may be different.

Embodiment 3

Hereinafter, the third embodiment of the present invention will be described with reference to the drawings.

Figure 12:
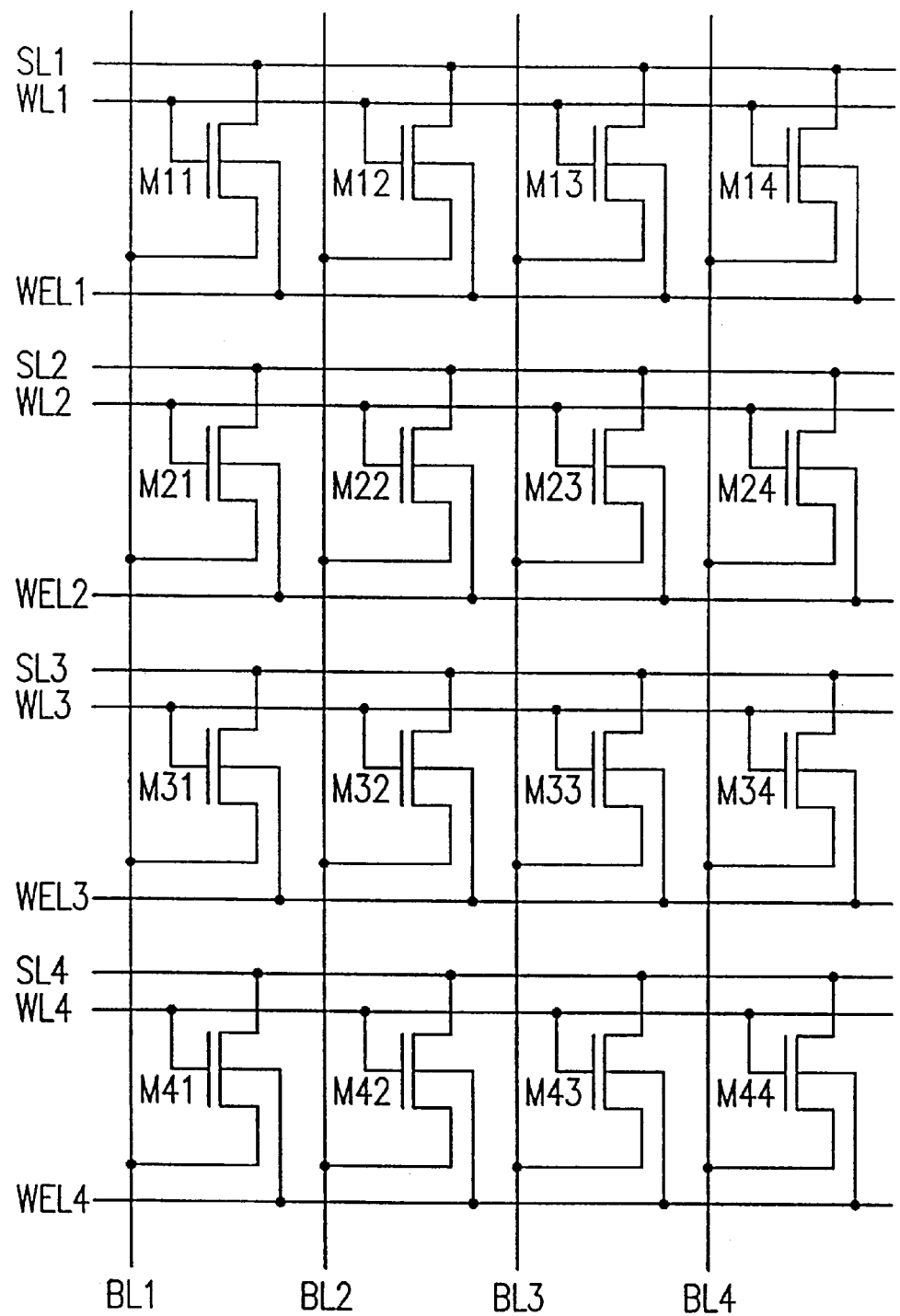
FIG. 12 is a schematic view showing a structure of a memory cell array of a non-volatile semiconductor memory device in the third embodiment of the present invention.
Figure 13:
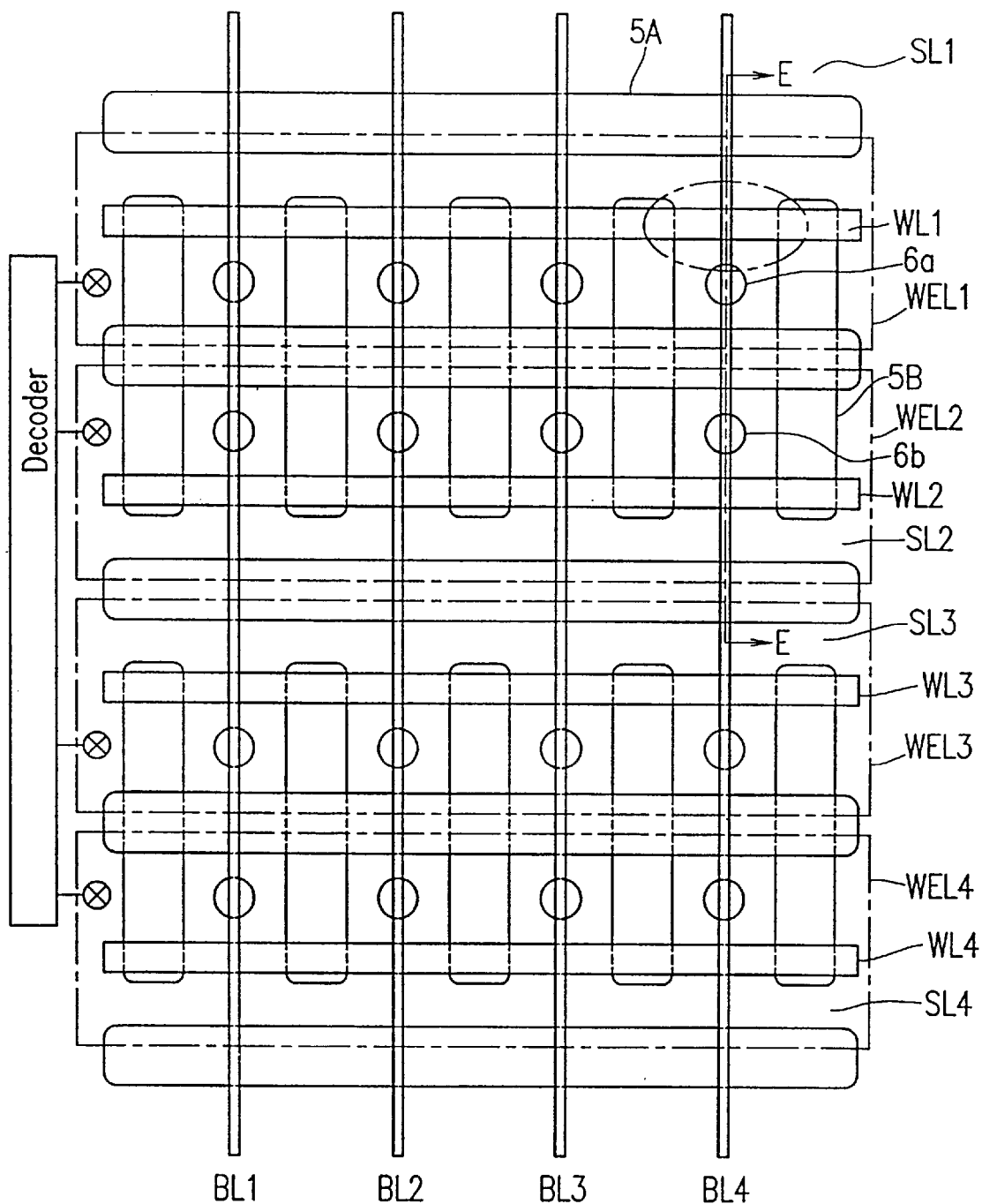
FIG. 13 is a schematic plan view showing a layout pattern of the non-volatile semiconductor memory device in the third embodiment of the present invention.
Figure 14:
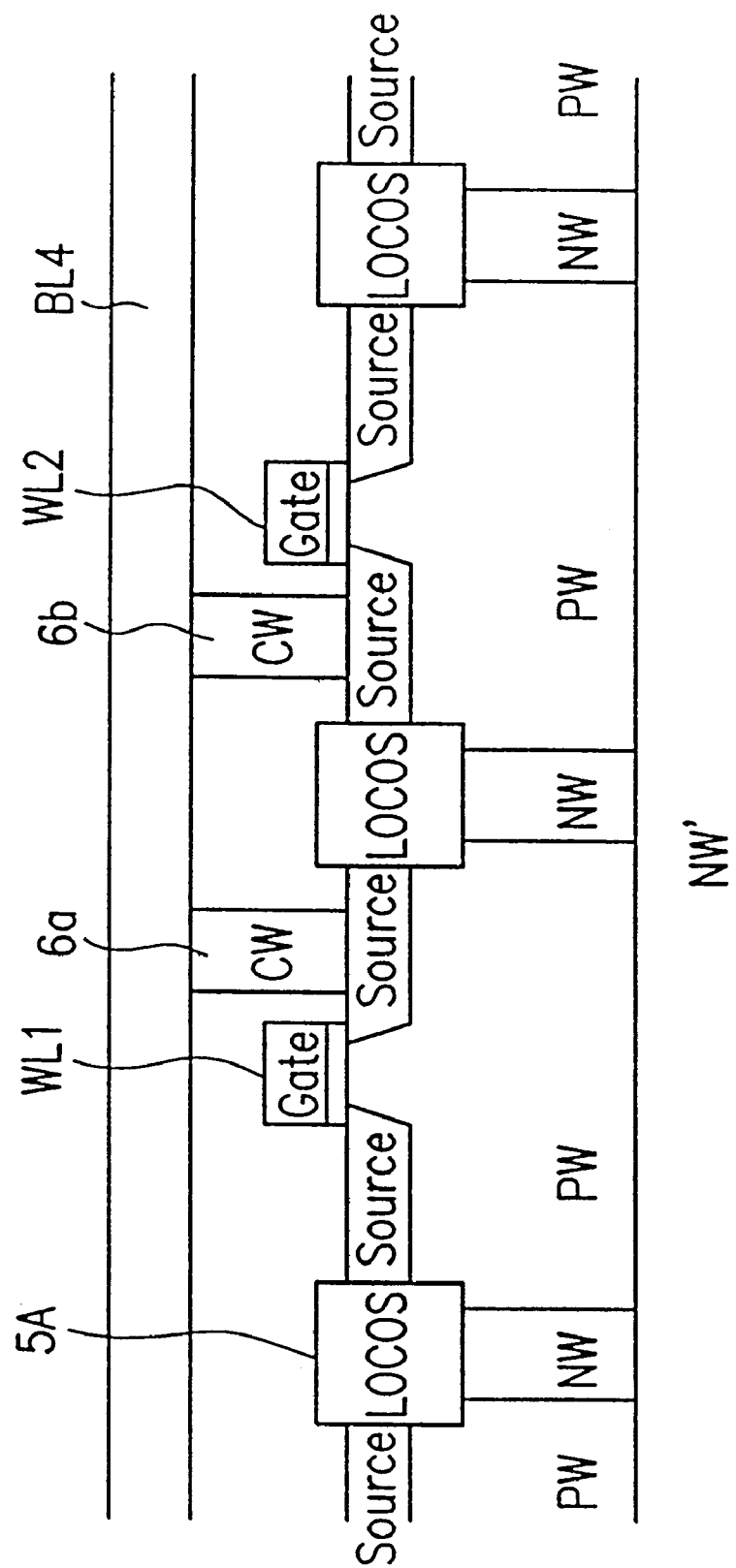
FIG. 14 is a cross-sectional view of the non-volatile semiconductor memory device in the third embodiment of the present invention taken along a line E—E shown in FIG. 13.
Figure 15:
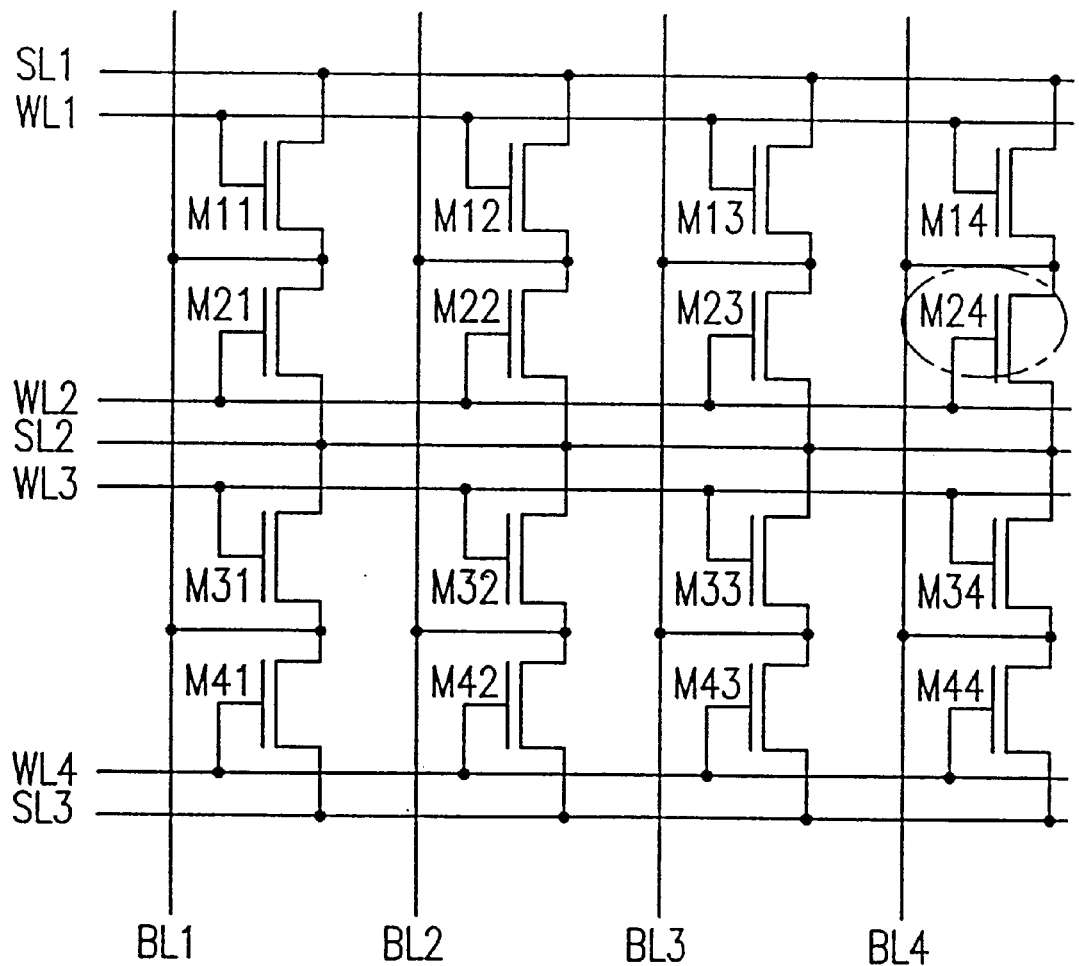
FIG. 15 is a schematic diagram showing a structure of a memory cell array of a conventional non-volatile semiconductor memory device.
Figure 16:
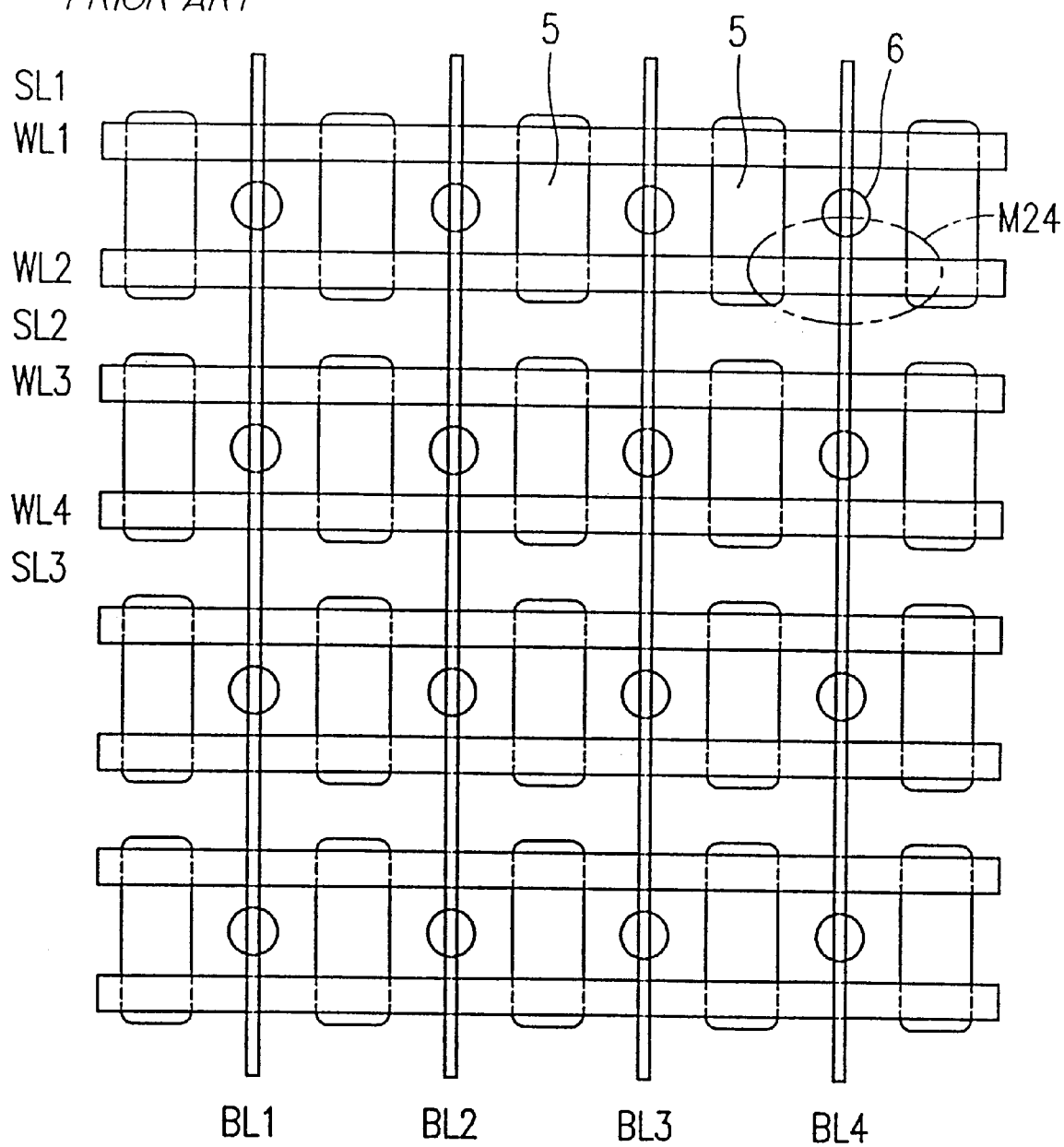
FIG. 16 is a schematic plan view showing a layout pattern of the conventional non-volatile semiconductor memory device shown in FIG. 15.
Figure 17:
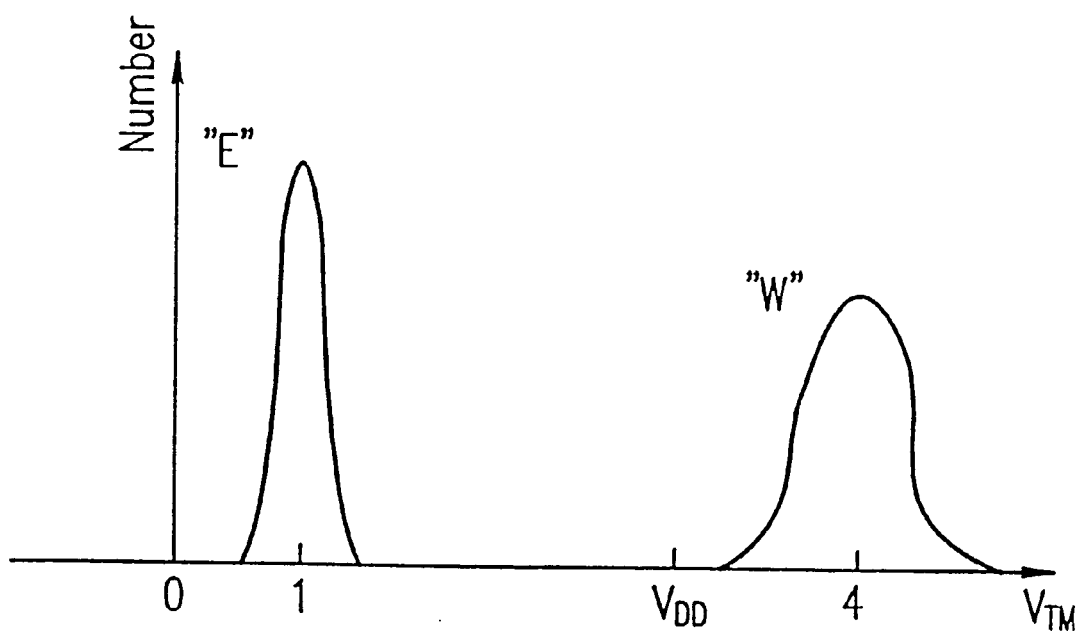
FIG. 17 is a threshold voltage distribution diagram of memory cells in the conventional non-volatile semiconductor memory device.

FIG. 12 is a schematic diagram showing a structure of a memory cell array of a non-volatile semiconductor memory device 30 in the third embodiment of the present invention. FIG. 13 is a schematic plan view showing a layout pattern of the non-volatile semiconductor memory device 30. More specifically, FIG. 13 shows an example of an array structure of the non-volatile semiconductor memory device 30 shown in FIG. 12. Furthermore, FIG. 14 is a cross-sectional view of the non-volatile semiconductor memory device 30 taken along a line E—E shown in FIG. 13.

The non-volatile semiconductor memory device 30 includes memory cells M11 through M44, word lines WL1 through WL4, source lines SL1 through SL4, and bit lines BL1 through BL4.

Furthermore, the non-volatile semiconductor memory device 30 includes isolation regions 5A and 5B, bit line contacts 6a and 6b, and well lines WEL1 through WEL4. The isolation regions 5A and 5B are formed by LOCOS, STI, etc. However, other methods may be used.

In the non-volatile semiconductor memory device 30, as shown in FIG. 12, the well line WEL1 is connected to the memory cells M11 through M14, the well line WEL2 is connected to the memory cells M21 through M24, the well line WEL3 is connected to the memory cells M31 through M34, and the well line WEL4 is connected to the memory cells M41 through M44. More specifically, memory cells in a certain row are connected to a well line corresponding to the row. The well lines are independent from each other on the row basis.

In the non-volatile semiconductor memory device 30, as shown in FIG. 12, the source line SL1 is connected to sources of memory cells in a row to which the memory cells M11 through M14 belong, the source line SL2 is connected to sources of memory cells in a row to which the memory cells M21 through M24 belong, the source line SL3 is connected to sources of memory cells in a row to which the memory cells M31 through M34 belong, and the source line SL4 is connected to sources of memory cells in a row to which the memory cells M41 through M44 belong. More specifically, in the non-volatile semiconductor memory device 30, memory cells in a certain row share a source line with memory cells in another row.

A plurality of memory cells connected to the same word line and the same source line share one well line.

Hereinafter, a read method of the non-volatile semiconductor memory device 30 of the present invention will be described in FIG. 12.

In FIG. 13, in the case where the memory cell M14 surrounded by a broken line is selected, an electric potential of a semiconductor substrate is set at a ground voltage (0 volts), the word line WL1 is set at about 3 volts (second voltage), and the bit line BL4 is set at about 1 volt (first voltage), respectively. Furthermore, the well line WEL1 is set at about 0 volts, the other word lines WL2, WL3, and WL4, the source lines SL1 through SL4, the other bit lines BL1, BL2, and BL3 are set at about 0 volts, and the well lines WEL2 through WEL4 are set at about −3 volts (third voltage). At least the well lines WEL1 through WEL4 are controlled by a decoder.

In the first and second embodiments, the threshold voltage of non-selected memory cells can be increased due to the back bias effect utilizing source lines. Even if the non-selected memory cells have a lower threshold voltage (e.g., about −1 volt), the lower threshold voltage can be set at about 0.5 volts or higher due to the back bias effect.

In the present embodiment, the effect similar to those of the first and second embodiments can be obtained by utilizing well lines.

As described above, in the third embodiment, a negative voltage (i.e., a voltage which is forward-biased with respect to the semiconductor substrate) is applied to well lines of the non-selected memory cells, whereby the threshold voltage of the non-selected memory cells can be increased. More specifically, in the case where the non-selected memory cells are in an erase state, the threshold voltage of the non-selected memory cells can be set so that the non-selected memory cells are in a depletion state.

As a result, even though the voltage applied to a memory cell in the non-volatile semiconductor memory device 30 is low, a sufficient amount of a current for reading information from the memory cell can be maintained.

In the first to third embodiments, a mask ROM has been described. However, the present invention is also applicable to a floating gate electrode type non-volatile semiconductor memory device in which information is stored by using two different threshold voltages. In this case, as far as the circuit configuration is concerned, the memory cells shown in FIGS. 1, 7, and 12 are replaced by floating gate electrode type memory cells.

Furthermore, in the first to third embodiments, a threshold voltage of a memory cell in an erase state is set so that the memory cell is in a depletion state. However, the present invention is not limited thereto. In the conventional non-volatile semiconductor memory device, it is required that a threshold voltage of non-selected memory cells in an erase state is set at about 0.5 volts in order to suppress a leak current from the non-selected memory cells. However, in the present embodiment, a leak current from the non-selected memory cells can be reduced, so that a threshold voltage of the non-selected memory cells in an erase state can be set lower than about 0.5 volts.

For example, a threshold voltage of a memory cell in an erase state may be desired to be set at about 0 volts depending upon the purpose, instead of being set so that the memory cell is in a depletion state. The present invention is also applicable to this case.

Furthermore, in the first to third embodiments, an erase state is set at the lower threshold voltage. However, a write state may be set at the lower threshold voltage.

In the first to third embodiments, a write state is set at the threshold voltage which is equal to a supply voltage or higher. However, a write state may be set at the threshold voltage which is equal to a supply voltage or lower, as long as there is a difference between the write state and the erase state.

Furthermore, in the first to third embodiments, N-type MOS transistors have been described. However, P-type MOS transistors may be used.

The present invention may be carried out by combining the first and second embodiments.

According to the present invention, a lower threshold voltage is set so that a memory cell is in a depletion state. Therefore, the difference in a threshold voltage between the write state and the erase state can be widened. Furthermore, the problem of variation of a threshold voltage after writing or after erasing, which is peculiar to a floating gate electrode type non-volatile semiconductor memory device, can be overcome, and multi-value threshold voltage can be easily obtained.

Furthermore, the present invention is applicable to general memories which perform a read operation using the variation of a current flowing through a memory cell. Some mask ROMs store information due to the presence and absence of bit line contacts. In this case, if a write state is set at an infinitely high threshold voltage, the present invention is applicable.

The present invention adopts a structure in which voltage applied to source lines or well lines of memory cells connected to the same bit line can be independently controlled, whereby a threshold voltage of non-selected memory cells connected to the same bit line is increased due to the back bias effect by controlling voltage applied to the source lines or well lines. Therefore, the lower threshold voltage can be set so that a memory cell is in a depletion state, and the amount of a current for reading information from a memory cell can be maintained at a low voltage. As a result, a non-volatile semiconductor memory device capable of performing high-speed reading at a low voltage can be obtained.

Furthermore, when at least a part of memory cells having a lower threshold voltage is set in a depletion state, the current for reading information from the memory cell in this state can be increased, and a read speed at a low voltage can be enhanced.

Furthermore, when a first voltage applied to a bit line and a third voltage applied to non-selected source lines are set at substantially the same voltage, the back bias effect is increased and a current does not flow from the source lines. Therefore, high-speed read performance can be enhanced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device comprising, on a semiconductor substrate, a plurality of memory cells arranged in a matrix, a plurality of word lines extending in a row direction, a plurality of source lines extending in the row direction, and a plurality of bit lines extending in a column direction, wherein a plurality of memory cells belonging to a certain row are connected to a first source line among the plurality of source lines, a plurality of memory cells belonging to a row adjacent to the certain row are connected to a second source line among the plurality of source lines, and the first source line is electrically independent from the second source line, the non-volatile semiconductor memory device further comprising:

means for applying a first voltage having a polarity reverse-biased with respect to the semiconductor substrate to a bit line to which a selected memory cell of the plurality of memory cells belongs;

means for applying a second voltage having the same polarity as the first voltage to a word line to which the selected memory cell belongs;

means for applying a third voltage having the same polarity as the first voltage to all of the source lines to which memory cells other than the selected memory cell belong; and means for applying an electric potential of the semiconductor substrate to the source line to which the selected memory cell belongs, thereby putting the threshold voltages of the memory cells other than the selected memory cell into an enhancement state.

2. A non-volatile semiconductor memory device according to claim 1, wherein the first source line is insulated from the second source line by an isolation region.

3. A non-volatile semiconductor memory device according to claim 1, wherein each of the plurality of memory cells is a MOS transistor having a gate electrode, a gate insulating film, a drain region, and a source region.

4. A non-volatile semiconductor memory device according to claim 1, wherein each of the plurality of memory cells is a floating gate electrode type MOS transistor having a control gate electrode, a floating gate electrode, a drain region, and a source region.

5. A non-volatile semiconductor memory device according to claim 1, wherein a memory cell having a lower threshold voltage among the plurality of memory cells is in a depletion state.

6. A non-volatile semiconductor memory device according to claim 1, comprising a plurality of first conductivity type wells extending in the row direction, wherein one of the plurality of memory cells is a MOS transistor having a gate electrode, a gate insulating film, a drain region, and a source region on one of the plurality of first conductivity type wells, and each of the plurality of first conductivity type wells is electrically independent.

7. A non-volatile semiconductor memory device according to claim 1, comprising a plurality of first conductivity type wells extending in the row direction, wherein one of the plurality of memory cells is a MOS transistor having a control gate electrode, a floating gate electrode, a gate insulating film, a drain region, and a source region on one of the plurality of first conductivity type wells, and each of the plurality of first conductivity type wells is electrically independent.

8. A non-volatile semiconductor memory device comprising, on a semiconductor substrate, a plurality of memory cells arranged in a matrix, a plurality of word lines extending in a row direction, a plurality of source lines extending in the row direction, and a plurality of bit lines extending in a column direction, wherein a first group among a plurality of memory cells belonging to a certain column are connected to a first bit line, among the plurality of bit lines, belonging to the certain column, a second group among the plurality of memory cells belonging to the certain column are connected to a second bit line, among the plurality of bit lines, belonging to the certain column, and the first bit line is electrically independent from the second bit line, the non-volatile semiconductor memory device further comprising:

means for applying a first voltage having a polarity reverse-biased with respect to the semiconductor substrate to a bit line to which a selected memory cell of the plurality of memory cells belongs;

means for applying a second voltage having the same polarity as the first voltage to a word line to which the selected memory cell belongs;

means for applying a third voltage having the same polarity as the first voltage to all of the source lines to which memory cells other than the selected memory cell belong; and means for applying an electric potential of the semiconductor substrate to the source line to which the selected memory cell belongs, thereby putting the threshold voltages of the memory cells other than the selected memory cell into enhancement state.

9. A non-volatile semiconductor memory device according to claim 8, wherein the first group is adjacent to the second group in the column direction.

10. A non-volatile semiconductor memory device according to claim 8, wherein each of the plurality of memory cells is a MOS transistor having a gate electrode, a gate insulating film, a drain region, and a source region.

11. A non-volatile semiconductor memory device according to claim 8, wherein each of the plurality of memory cells is a floating gate electrode type MOS transistor having a control gate electrode, a floating gate electrode, a drain region, and a source region.

12. A non-volatile semiconductor memory device according to claim 8, wherein a memory cell having a lower threshold voltage among the plurality of memory cells is in a depletion state.

* * * * *